June 24, 1969 C. R. HUNTLEY 3,452,290

LOW DISTORTION VARIOLOSSER

Filed Sept. 12, 1967

INVENTOR.
CHRISTOPHER R. HUNTLEY

BY Glenn H. Antrim

ATTY.

3,452,290
Patented June 24, 1969

3,452,290

LOW DISTORTION VARIOLOSSER

Christopher R. Huntley, Burnaby, British Columbia, Canada, assignor to Automatic Electric Laboratories, Inc., a corporation of Delaware Filed Sept. 12, 1967, Ser. No. 667,155
Int. Cl. H03f *1/08, 1/12, 1/34*
U.S. Cl. 330—28 1 Claim

ABSTRACT OF THE DISCLOSURE

A variolosser has a field-effect transistor as a controlled variable resistance element. A voltage divider connected to the drain and the gate of the transistor in a bootstrap arrangement supplies sufficient signal voltage from the drain to the gate to cancel modulation of the channel resistance of the transistor which would otherwise be caused by application of signal to the drain only.

*Background of the invention*

This invention relates to variolossers or attenuators, and more particularly to variolossers used in co-operation with regulators and equalizers in wave transmission circuits and networks. Prior variolossers, in which attenuation of signal proportional to the level of input signal is provided have used in different circuits several different types of variable-resistance components, but not any of them individually provide all the desirable characteristics of reliability, low distortion, low cost, and low power consumption. Both diodes and junction transistors are reliable and inexpensive, but they cause too much distortion for high quality circuits. Thermistors cause little distortion, but they have the disadvantages of being sensitive to temperature changes and of requiring greater power from their transmission circuits than is required by semi-conductor devices. Light controlled photoconductors cause little distortion, but they are expensive, require too much power, and are not as reliable as desired; and likewise chemical devices dependent upon ion migration have similar disadvantages.

*Summary*

The variable resistance element of the variolosser of this invention is a FET (field-effect transistor) with a bootstrap circuit added to reduce distortion. As a variable resistance element, the FET has in addition to the usual advantages of diodes and junction transistors the advantage of being adaptable to the use of a bootstrap circuit for greatly reducing distortion normally caused by nonlinear characteristics of source-drain current with changes in drain voltage. In an attenuator using a FET without a bootstrap circuit, the signal voltage present on the drain of the FET modulates the source in drain current or resistance by modulating the width of the source-drain channel to the same extent as if a fraction of the signal voltage determined by the construction of the FET (one-half the signal voltage for the commonly used types in which the drain and source are symmetrically disposed relative to the gate) were applied to an intermediate portion of the channel proximate the gate (commonly, the midpoint). This modulation causes noticeable distortion. In a circuit according to this invention, the distortion is greatly reduced by coupling that fraction of the signal voltage apparently effective in the area about the gate, because of signal voltage present between the source and the drain, directly to the gate for canceling the effect of voltage applied to the drain only. The usual direct-current control voltage is also applied in the usual manner to the gate for controlling the average resistance of the source-drain circuit.

*Description of the preferred embodiment*

Figure 1:
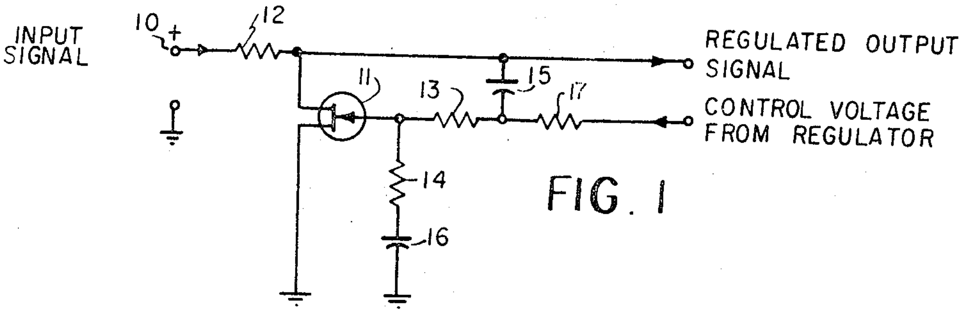
FIG. 1 is a schematic diagram of a low-distortion variolosser circuit which has a FET with a bootstrap circuit.

A basic controlled variable attenuator which uses a FET with a bootstrap circuit is shown in FIG. 1. Different types of FET's having high input impedance may be used for the FET 11. In the embodiments shown in FIGS. 1 and 3, each of the FET's is the junction type having a N-channel.

Referring to the basic variolosser circuit of FIG. 1, an input terminal 10 for one conductor of an incoming transmission line is connected through a resistor 12 to a conductor of an outgoing line which is to receive regulated output signal. The terminal of the resistor 12 which is connected to the output, is also connected to the drain of the FET 11, and the source of the FET is connected through ground to the other conductor of an incoming line. Thus the resistor 12 and the source-drain circuit of the FET 11 form a variable voltage divider across the incoming line with the output line being connected to an intermediate tap and the source-drain circuit being a voltage-controlled variable element.

The resistors 13 and 14 are connected in series, and the outer ends are connected respectively through coupling capacitors 15 and 16 across the output circuit. The junction of the resistors 13 and 14 is connected to the gate of the FET 11 so that a bootstrap arrangement is formed for applying one-half the signal voltage on the drain of the FET 11 to its gate. A control voltage circuit, for applying direct-current voltage proportional to the voltage of the regulated output signal to the gate of the FET 11, is conneced through an isolation resistor 17 to the junction of the resistor 13 and the coupling capacitor 15.

Figure 2:
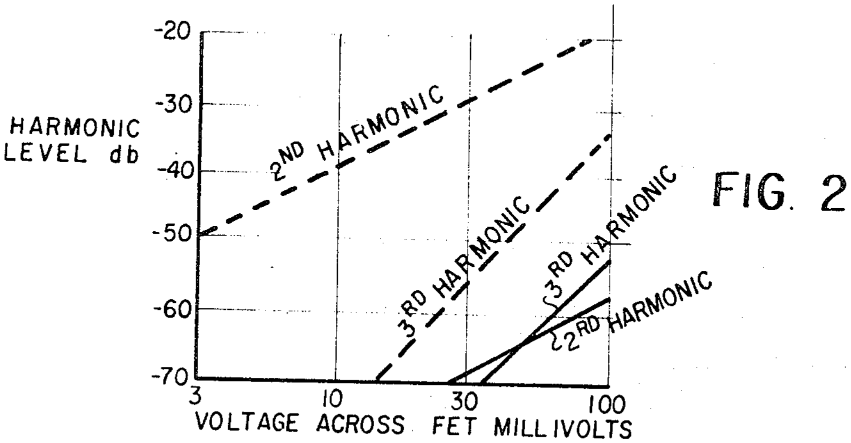
FIG. 2 is a graph showing the relative amounts of distortion in FET circuits with bootstrap circuits and in similar circuits without bootstrap circuits.

The graph of FIG. 2 shows the extent that quality of output signal is improved by the addition of a bootstrap circuit. The two dashed lines represent respective second and third harmonic distortions in the output of a circuit like that shown in FIG. 1 except that the voltage-divider bootstrap circuit, comprising resistors 13 and 14 and associated coupling capacitors 15 and 16, is omitted; the solid lines show the extremely low distortion content of the output of the complete circuit of FIG. 1. The reduction in distortion provided by the circuit of FIG. 1 is approximately 40 decibels. Obviously, the curves show that distortion decreases rapidly with a decrease in signal across the source-drain circuit of the FET.

Figure 3:
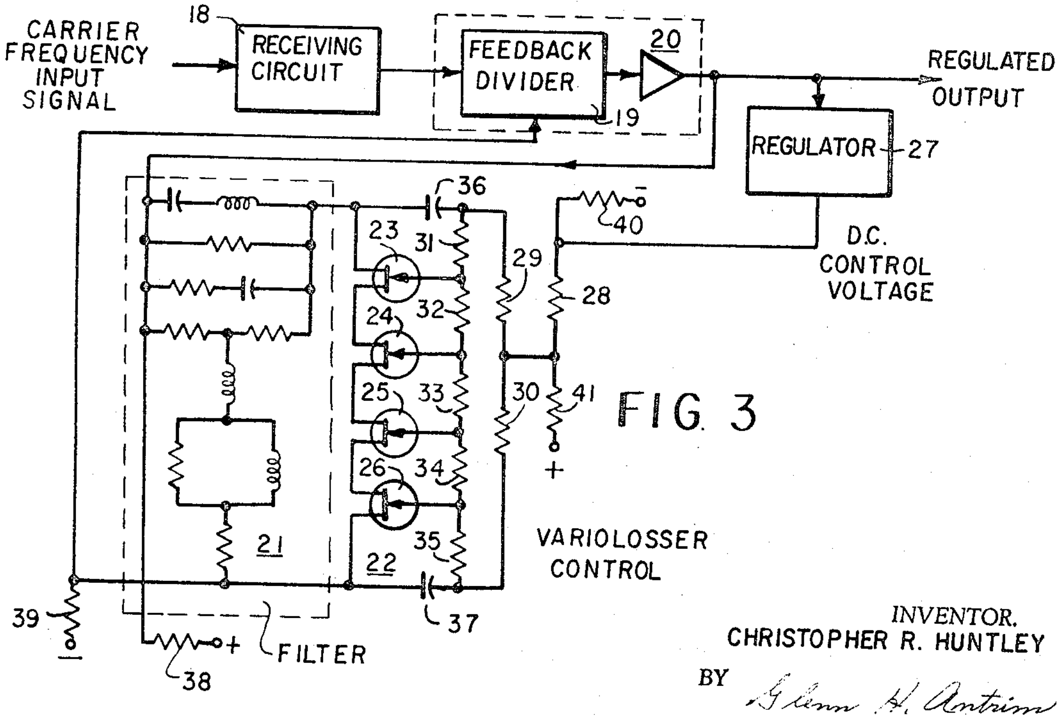
FIG. 3 is a schematic diagram of a preferred embodiment of the variolosser connected in a transmission circuit to show its use in a negative feedback circuit of an amplifier.

FIG. 3 shows a preferred variolosser circuit having a plurality of FET's with their source-drain circuits in series and with their outputs bootstrapped to their inputs. Through the use of this series arrangement, less signal voltage is developed across each source-drain circuit than if only a single FET were used as in FIG. 1, and the distortion of the series circuit is still lower because of the low distortion resulting from each FET operating at low signal level. Regulated signal voltage in the bootstrap circuit is divided and applied such that signal voltage applied to each gate is one-half (assuming symmetrical FET's) that across the respective source-drain circuit. Direct-current control voltage is effectively applied in parallel to the gates of the transistors.

In more detail, the variolosser of FIG. 3 is included in a negative or degenerative feedback circuit of an amplifier in a transmission circuit. A carrier signal transmission circuit, which may have many telephone signal channels and one or more television signal channels, is connected through suitable receiving circuits 18 to a feedback divider 19 at the input of an amplifier 20. The output circuit of the amplifier 20 is connected through a frequency-compensating filter 21 and the variolosser 22, which has a plurality of FET's in series, to the feedback divider 19. The connections to the divider 19 are conventional for providing a desired amount of feedback. Particularly, signal from the output of the amplifier 20 may be traced through the filter 21 and the source-drain circuits of FET's 23, 24, 25, and 26 successively to the feedback divider 19.

A direct-current control voltage proportional to the output of the amplifier 20 is developed by a regulator 27 for application to the gates of the FET's 23–26. The output circuit of the amplifier 20 in addition to being connected to succeeding carrier transmission circuits for supplying regulated carrier to them, is connected to the input of the regulator 27. The regulator develops a control voltage of the proper polarity to cause the resistance of the series source-drain circuits of the FET's 23–26 to vary inversely with the level of the output signal. The circuit for applying control bias can be traced through a resistor 28, resistors 29 and 30, and resistors 31–35 of a voltage divider having successive junctions connected to different gates of the FET's 23–26. Because direct-current flow in the gate circuits is small, the negligible direct-current voltage drop in the voltage divider has little effect on changing the average bias applied to the gates.

The voltage divider comprising the resistors 31–35 functions in the bootstrap circuit to divide signal voltage applied from the amplifier 20. The drain of the FET 23, which is connected to the output of the filter 21, is coupled through a capacitor 36 to the resistor 31 at one terminal of the voltage divider, and the source of the FET 26 is coupled through a capacitor 37 to the resistor 35 at the other terminal of the divider. The voltage divider at signal frequencies is therefore in parallel with the series source-drain circuits of the FET's 23–26. Each of the terminal resistors 31 and 35 has one-half the value of each of the intermediate resistors 32, 33, and 34. The drains of the FET's 31–35 are connected successively to the junctions of the resistors 31–35 in the same order as the respective source-drain circuits are connected in series in the signal so that one-half as much signal voltage exists between the gate and source of each FET as that which exists between its drain and source.

Direct-current operating voltages are applied in a manner not shown in detail through the feedback divider 19 to the series source-drain circuits of the FET's 23–26. To indicate the proper voltages for operating the N-channel FET's of FIG. 3, positive potential is shown connected through an isolation resistor 38 for application through resistors of the filter 21 to the drain of the FET 23, and negative potential through an isolation resistor 39 to the source of the FET 26. Resistors 40 and 41 and the resistor 28 are connected in series with a source of direct-current potential for applying required level of fixed negative bias to the gates of the FET's 23–26. The FET's are operated well below the pinch-off point on their source-drain voltage characteristic curve. The fixed negative bias for the gates is adjusted so that a desired control range is obtained in co-operation with the application of control voltage from the regulator 27.

When N-channel FET's are used, positive control voltage is developed at the output of the regulator 27 in proportion to the level of the carrier signal at the output of the amplifier 20 to oppose the fixed bias. For example, when the level tends to increase, a decreased negative bias is applied to the FET's 23–26 to widen the channels in their respective source-drain circuits to cause a decrease in resistance in the feedback circuit. Therefore, the amount of negative feedback around the amplifier 20 increases to cause its gain to decrease for decreasing the level of signal at the output of the amplifier to a level close to a predetermined level.

A variolosser having the circuit of FIG. 3 can be manufactured at moderate costs, and it is reliable. Because of the high impedance of the gate circuits of the FET's, little control power is required. The inherent time constant is negligible to contribute to the execllent dynamic characteristics of the regulated transmission system. Second harmonic distortion introduced by a typical variolosser according to FIG. 3 is 90 decibels below the level of the transmitted signal, and the third harmonic distortion is 110 decibels below the level of transmission.

What is claimed is:

1. In an amplifier circuit having a variable-impedance feedback circuit for controlling the gain thereof; a plurality of field-effect transistors, each of said transistors having a source, a drain, and a gate, the source-drain circuits of said transistors being connected in series in said variable-impedance feedback circuit, a voltage divider having a plurality of taps, the drain at one end of said series source-drain circuit being coupled in a signal circuit to said voltage divider and to the output of said amplifier circuit, a direct-current control-voltage circuit connected between the output of said amplifier circuit and said voltage divider, each of said gates of said transistors being connected to a respective one of said taps such that variations in direct-current voltage from said control-voltage circuit causes a desired variation of impedance in said feedback circuit, and the amount of signal applied from the output of said amplifier through said voltage divider to each of said gates substantially cancelling variations in resistance of said source-drain circuit caused by signal being applied to said drain at said one end of said series source-drain circuit.

References Cited

UNITED STATES PATENTS 3,213,299 10/1965 Rogers.

OTHER REFERENCES

Todd, "FETS as Voltage-Variable Resistors," Electronic Design, Sept. 13, 1965, vol. 13, No. 9, pp. 66–69.

ROY LAKE, *Primary Examiner.*

JAMES B. MULLINS, *Assistant Examiner.*

U.S. Cl. X.R.

330—29, 86, 145